United States Patent [19]

Götze et al.

[11] 4,394,627
[45] Jul. 19, 1983

[54] AUDIOMETER WITH PHOTO SENSITIVE, DIGITALLY TUNABLE LOW DISTORTION OSCILLATOR

[75] Inventors: Gerd-Wolfgang Götze; Manfred Müller, both of Berlin, Fed. Rep. of Germany

[73] Assignee: Robert Bosch GmbH, Stuttgart, Fed. Rep. of Germany

[21] Appl. No.: 237,107

[22] Filed: Feb. 23, 1981

[30] Foreign Application Priority Data

Mar. 26, 1980 [DE] Fed. Rep. of Germany ....... 3011651

[51] Int. Cl.³ ............................................. H03B 5/20
[52] U.S. Cl. ...................................... 331/66; 179/1 N;
 250/568; 331/179; 340/347 P
[58] Field of Search ................... 331/179, 177 R, 155,
 331/111, 113 R, 140, 141, 142, 137, 143, 144,
 66; 340/347 P, 825.73, 825.39, 825.48, 825.56;
 250/569, 568, 570; 328/2; 334/53, 55; 179/1 N

[56] References Cited

U.S. PATENT DOCUMENTS

| 3,453,599 | 7/1969 | Lester | 340/825.73 |
| 3,601,584 | 8/1971 | Kashio | 250/569 X |
| 3,891,939 | 6/1975 | Bennett et al. | 331/179 X |
| 4,021,756 | 5/1977 | Podowski et al. | 331/179 X |

OTHER PUBLICATIONS

Gerd Koetter Low non Linear Distortion; Harmonic Distortion Funkschau 1978, Heft 8, pp. 347, 348.

*Primary Examiner*—Siegfried H. Grimm
*Assistant Examiner*—Tim A. Wiens
*Attorney, Agent, or Firm*—Frishauf, Holtz, Goodman & Woodward

[57] ABSTRACT

To provide for tuning of an oscillator circuit, a plurality of resistors are selectively connectable in the circuit. To provide for reproducible, accurate oscillation frequency in accordance with switching of a respective resistor in dependence on a digital input signal, electronic switches are respectively connected to the resistors to connect them in circuit in the oscillator to thereby eliminate variable contact resistances of mechanical switches. A digital frequency control signal is generated by placing a movable mask or pattern with openings therein between an array, for example a linear strip of light emitting diodes, and a similar strip of photo transistors, the respective energization of which is determined by openings in the diaphragm. The signals from the photo transistors are stored in a memory, typically a group of flip-flops, for application to the electronic switches controlling connection of the respective resistors in the oscillator circuit.

8 Claims, 1 Drawing Figure

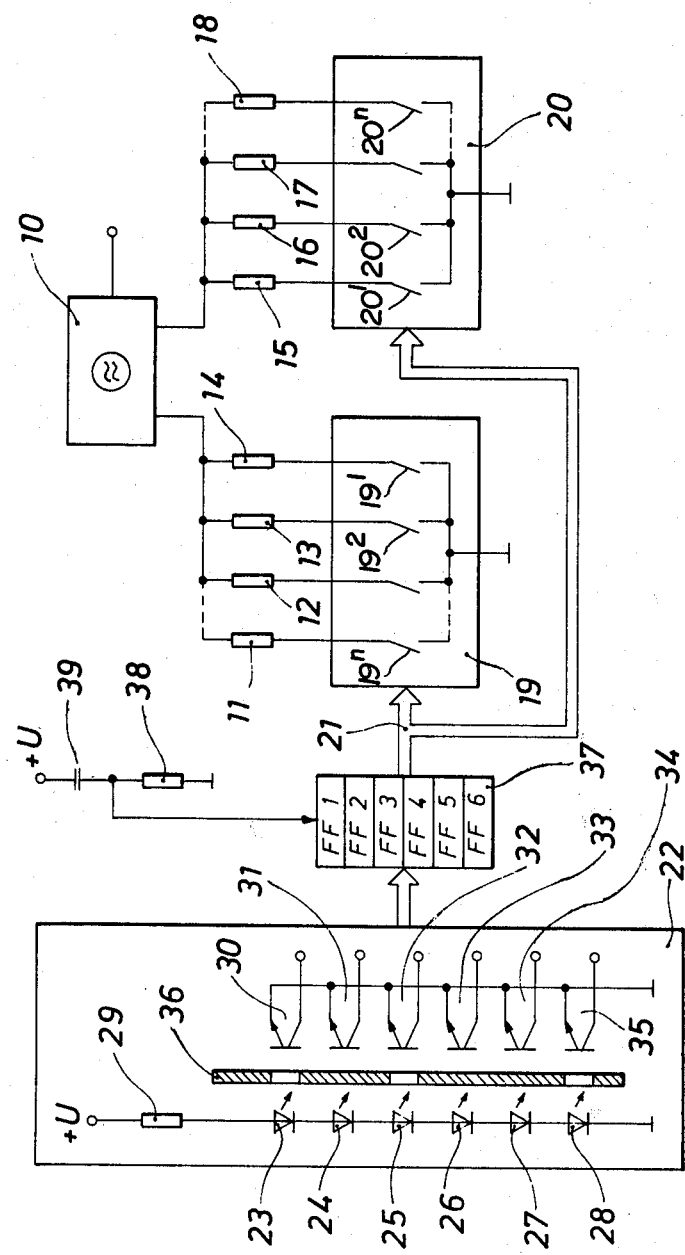

AUDIOMETER WITH PHOTO SENSITIVE, DIGITALLY TUNABLE LOW DISTORTION OSCILLATOR

The present invention relates to an audiometer, and more particularly to a tunable low-frequency oscillator therefor having low non-linear or harmonic distortion, and in which the tuning frequency can be digitally controlled.

BACKGROUND AND PRIOR ART

The referenced article "Low-Frequency Generator with Low Non-linear or Harmonic Distortion", by Gerd Koetter, in the publication "FUNKSCHAU" 1978, issue No. 8, pages 109, 110, and particularly FIG. 5 of the article, discloses a tunable oscillator in which the frequency of oscillation is determined by a resistor. The particular oscillator there referred to comprises two operational amplifiers which are cascaded and connected in an oscillatory circuit. By use of a phase shift circuit in combination with the operational amplifiers, adjustable resistances can be used to vary the frequency of oscillation of the overall circuit over a wide range. By changing of the resistance of the respective resistor or resistors, the oscillator is tuned. Tuning ranges in the order of 2000:1 can be obtained, with extremely low distortion.

The adjustable resistors in the oscillator circuit usually use potentiometers or switchable resistors. Mechanical switches as well as potentiometers have disadvantages in that the contact resistance of the elements has to be considered and may vary from adjustment to adjustment; the contact resistance of the slider of a potentiometer must be included in the resistance which determines the frequency of oscillation. The contact resistance both of sliders as well as of switch contacts changes with age, use, corrosion of the contact surfaces, and the like. In order to obtain accurate reproducibility of resistances in a switchable resistance arrangement, it has been proposed to use contacts having noble metal coatings, for example gold contacts. Such types of contacts are expensive.

THE INVENTION

It is an object to provide an oscillator circuit which can be digitally controlled, and in which the frequency of oscillation is independent of uncontrolled external influences.

Briefly, two or more operational amplifiers are connected in cascade, such that one or more operational amplifiers provide for phase shift at their outputs in accordance with the resistance setting of an adjustable resistor, the output then being applied to another operational amplifier in a different circuit, the output of which is fed back to the input of the cascaded group of operational amplifiers. The frequency of the circuit is determined by a plurality of resistors connected to the operational amplifiers. The connection pattern of the resistors then is controlled to determine the frequency of oscillation of the system. In accordance with the invention, and to provide for tuning of the circuit in digital steps, the frequency control includes a plurality of electronic switches, controlled in accordance with digital input signals by opto-electronic sensors which are energized in accordance with a suitable pattern, for example applied through a mask.

In accordance with a feature of the invention, a plurality of resistors are connected in the circuit, and a like plurality of switches are provided, one each connected in series with the respective resistor. The switch control means then comprises a circuit providing binary digital output signals to the switches to control, selectively, energization, and hence closing thereof.

The audiometer, with the particular oscillator has the advantage that the frequency of oscillation is determined by a plurality of single resistors which can be accurately calibrated and which are connected in the oscillatory circuit electronically, that is, without movable or mechanical contacts. Switching clicks are avoided, and the frequencies of oscillator operation are accurately reproducible, which is important in audiometers.

A digital control signal is preferably generated by a mask with openings therein which is interposed between an array of light generating elements, such as light emitting diodes (LEDs), which are in light-transmitting relation to photo transistors. The diaphragm or mask, with selected openings, is mechanically movable, e.g. slidable to expose selected ones of the photo transistors to light from the LEDs, the photo transistors then selectively controlling closing of the electronic switches which, for example, may be transistors. In accordance with a preferred feature of the invention, a memory is interposed between the respective electronic switches and the photo transistors, for example in the form of flip-flops, which receive new data at their inputs as position of the slider mark is changed. A start-up circuit is preferably provided, connected with the inputs or transfer inputs of the memory in order to insure that, when the apparatus is started up, the memory will assume a state which corresponds with the respective position of the mask or slider between the LEDs and the photo transistors. Such a start-up circuit may, simply, be an R/C circuit providing a pulse to the flip-flops forming the memory when the main energization switch is closed.

DRAWING

The single FIGURE is a schematic circuit diagram of the oscillator control system.

An oscillator 10, for example of the type described in the referenced and above referred-to publication, has a plurality of resistors 11, 12, 13, 14 in one branch, and 15, 16, 17, 18 in another branch thereof. The two groups of resistors 11–14 and 15–18 are connected, on the one hand, between the components of the oscillator 10 and, on the other, with respective switches 19, 20. The switches 19, 20 are formed by an array of electronic switches $19^1, 19^2 \ldots 19^n$ and $20^1, 20^2 \ldots 20^n$ shown only schematically for simplicity of the drawing. Preferably, the resistors in a similarly placed connection line may be equal, such as resistors 14, 15; 13, 16, etc. The electronic switches 19, 20 are formed as multiplex switches and have the function to connect the respective resistors between the oscillator 10 and ground or chassis. Control of the respective switch elements $19^1, 20^1$; $19^2, 20^2$; $19^n, 20^n$ is effected by a control connection 21 from a memory 37.

In accordance with a preferred embodiment of the invention, the digital control signal is derived from an opto-electronic device 22. The opto-electronic device 22 includes a plurality of LEDs 23, 24 . . . 28 and associated photo transistors 30, 31 . . . 35. A diaphragm or mask 36, with suitably placed openings, is positioned between the LEDs and the photo transistors. The LEDs 23 to 28 are serially connected between ground and a supply voltage +U through a resistor 29. The photo transistors 30 to 35 have their emitters jointly connected and in turn to ground to chassis; the collectors are connected to respective data outputs of the opto-electronic control element 22. The mask or diaphragm 36 has openings formed therein in the shape of a binary bit pattern; the output of the opto-electronic control element 22 thus will be a digital signal which has a characteristic which depends on the position of the mask or diaphragm 36 with respect to the LEDs and the photo transistors. The mask or diaphragm 36, for example, is movable in a plane perpendicular to the plane of the drawing. In the position shown, openings are formed between the LEDs/photo transistor combinations 23/30, 25/32, 28/35. The output of the unit 22 thus is a digital output signal having the designation 101001.

In accordance with a preferred feature of the invention, the digital output signal of the opto-electronic control unit 22 is applied to the memory 37. This memory, as shown, includes six flip-flops (FFs) which are associated with the respective collectors of the photo transistors 32, 35. Each flip-flop is SET if a positive logic 1-signal appears at the output thereof. Upon shifting of the diaphragm or mask 36, the openings between the respective LEDs and photo transistors are changed in accordance with the bit pattern in the diaphragm or mask 36, and the FFs will receive new data at their inputs which they apply, stored, to the multiplex switches 19, 20.

To insure proper frequency positioning of the oscillator 10 each time the apparatus is started, in strict dependence on the then existing position of the diaphragm 36 with respect to the photo transistors 30–35, an R/C circuit 38, 39 is provided connected to a positive supply voltage which, when energized, applies a pulse to the transfer or "store" input of the FFs of the memory 37. Thus, upon first starting the apparatus, the FFs will be set in accordance with the respective switching state of the connected photo transistors 30 to 35. The FFs preferably are D-FFs.

The switches $19^1, 19^2 \ldots 19^n; 20^1, 20^2 \ldots 20^n$ preferably are formed by multiplexers, for example of the type: MC 14 051 (MOTOROLA). Other types of electronic switches may be used, particularly if the switching transfer resistance of the respective switches can be accurately predetermined, and maintained over a long period of time. The respective energization and hence closing pattern of the switch elements $19^1, 20^1; 19^2, 20^2; \ldots 19^n, 20^n$ can be determined in binary digital form to provide a large number of digitally controlled accurately reproducible frequencies of oscillation from the oscillator 10 by selective single or multiple closing of respective switches of the arrays 19, 20, and hence placing of respective resistors 11–14; 15–18 in circuit, as desired.

The accurate reproducibility of frequency with respect to a predetermined digital input value renders the entire system particularly useful for e.g. audiometers which serve for testing the hearing of patients at different audio frequencies. An audiometer provided with the depicted oscillator additionally avoids clicks when the frequencies of oscillations are changed over because of the fact that there are no electro-mechanical switches in this oscillator device.

We claim:

1. Audiometer having a low distortion, reproducible tunable oscillator including
    an oscillator circuit (10);
    a plurality of resistors (11–14; 15–18) in the oscillator circuit;
    a like plurality of electronic switches ($19^1, 19^2 \ldots 19^n$; $20^1, 20^2 \ldots 20^n$), one, each, connected in series with the respective resistor,
    the connection pattern of the switches determining the operating frequency of the oscillator circuit;
    and an opto-electronic switch control means providing binary digital output signals to said switches to control selective closing thereof and hence placing selected resistors in the oscillator circuit,
    wherein the opto-electronic control means comprises
    a source of light (23–28);
    a plurality of light responsive elements (30–35);
    and a movable selective light transmission-blocking masking means having selective openings permitting light transmission between said light source and the light responsive elements, selectively, in accordance with the positioning of said openings and the blocking means with respect to the light responsive elements, to determine the tuning frequency of the oscillator in accordance with the position of the masking means, and for shifting the tuning frequency upon shifting of the masking means, free from switching clicks.

2. Audiometer according to claim 1, wherein the light source comprises a plurality of light emitting diodes (23–28), positioned to emit light to the respective light responsive elements.

3. Audiometer according to claim 1, wherein the light responsive elements are photo transistors (30–36).

4. Audiometer according to claim 1, further including at least one electronic memory (37) connected between the switches and said opto-electronic switch control means (22).

5. Audiometer according to claim 4, further including a start-up pulse circuit (38, 39) connected to the memory (37) to set the memory for reception of input data from said opto-electronic switch control means.

6. Audiometer according to claim 1, wherein the light source comprises a plurality of light emitting diodes (23–28), positioned to emit light to the respective light responsive elements;
    and wherein the light responsive elements are photo transistors (30–36).

7. Audiometer according to claim 6, further including at least one electronic memory (37) connected between the switches and said opto-electronic control means (22).

8. Audiometer according to claim 7, further including a start-up pulse circuit (38, 39) connected to the memory (37) to set the memory for reception of input data from said opto-electronic switch control means.

* * * * *